United States Patent [19]

Baudin et al.

[11] 4,249,958
[45] Feb. 10, 1981

[54] PANEL COMPRISING AT LEAST ONE PHOTO-VOLTAIC CELL AND METHOD OF MANUFACTURING SAME

[75] Inventors: Pol Baudin, Fontaine-l'Eveque; Lucien Leger, Montigny-le-Tilleul; Pierre Collignon, Marcinelle, all of Belgium

[73] Assignee: BFG Glassgroup, Paris, France

[21] Appl. No.: 46,320

[22] Filed: Jun. 7, 1979

[30] Foreign Application Priority Data

Jun. 14, 1978 [GB] United Kingdom .............. 26973/78

[51] Int. Cl.³ ............................................ H01L 31/04
[52] U.S. Cl. .................................. 136/251; 136/259; 156/99; 156/107; 156/286
[58] Field of Search ..................... 136/89 EP, 89 CA; 156/99, 107, 286

[56] References Cited

U.S. PATENT DOCUMENTS

| 3,957,537 | 5/1976 | Baskett et al. | 136/89 |
| 4,147,560 | 4/1979 | Gochermann | 136/89 EP |

FOREIGN PATENT DOCUMENTS

2349959  11/1977  France .................................. 136/89 EP

OTHER PUBLICATIONS

W. Carroll et al, "Material & Design Considerations of Encapsulants For Photo-Voltaic Arrays In Terrestrial Applications", *Conf. Record, 12th IEEE Photo-Voltaic Specialists Conf.,* (1976), pp. 332-339.
"Terrestrial Solar Module-Type BPX 47A", Amperex Electronic Corp. Product Literature, Apr. 1978.
D. C. Carmichael et al, "Materials For Encapsulation Systems For Terrestrial Photovoltaic Arrays", *Conf. Record, 12th IEEE Photovoltaic Specialists Conf.* (1976), pp. 317-331.

*Primary Examiner*—Aaron Weisstuch
*Attorney, Agent, or Firm*—Cushman, Darby & Cushman

[57] ABSTRACT

In order to reduce or prevent absorption of water in the adhesive of a panel comprising at least one photovoltaic cell located between a transparent sheet and a second sheet bonded together using an adhesive material, the invention provides that another material is applied at least in part between the sheets to form a moisture barrier which surrounds the cell(s) and the adhesive.

The preferred adhesive material is polyvinyl butyral, and the preferred barrier forming material is selected from neoprene based adhesives, polysulphide adhesives and polyvinylidene chloride. When the latter is used a second barrier forming material such as polysulphide adhesive is preferably interposed between the adhesive and the polyvinylidene chloride.

17 Claims, 5 Drawing Figures

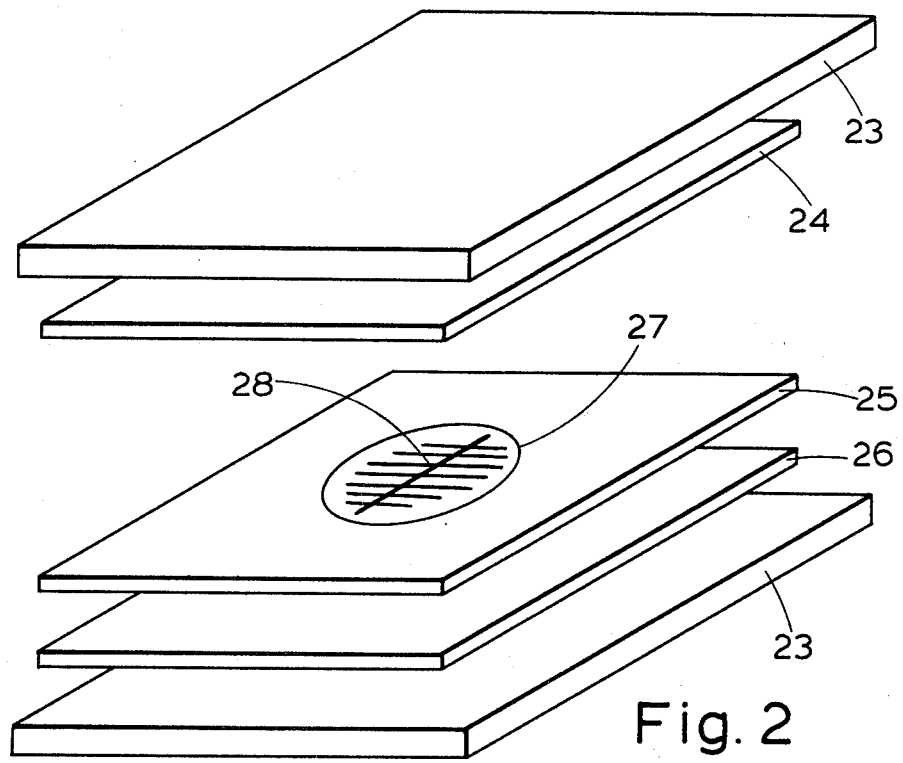
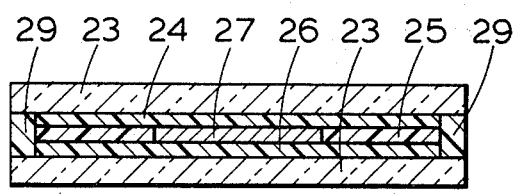
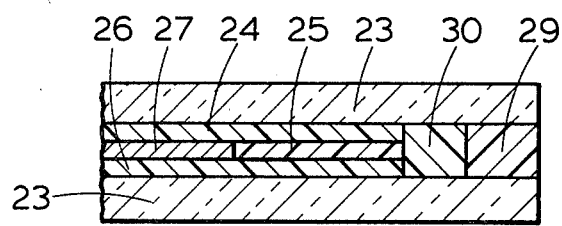

PANEL COMPRISING AT LEAST ONE PHOTO-VOLTAIC CELL AND METHOD OF MANUFACTURING SAME

The present invention relates to a method of manufacturing a panel comprising at least one photo-voltaic cell located between a transparent sheet and a second sheet bonded together using an adhesive material. The invention also relates to such panels.

Such panels are useful inter alia for transducing incident solar energy into electrical energy.

Various types of photo-voltaic cells are known, for example silicon cells, cadmium sulphide cells, copper sulphide-cadmium sulphide cells, cadmium telluride cells, copper telluride-cadmium telluride cells, gallium arsenide cells and indium phosphide cells.

In use, solar panels incorporating such cells are exposed to direct solar radiation with the result that the adhesive medium between the two sheets may deteriorate in the course of time, allowing atmospheric moisture to penetrate into the unit and this has an adverse effect on the efficiency of an enclosed photo-voltaic cell.

One particular way in which moisture can penetrate into a said panel is as follows: the moisture is absorbed at the edges of the layer of adhesive which bonds the panel together, and this can have an adverse effect on an adhesive-sheet bond, so that in time, the sheet and adhesive separate at the edges of the panel. This in turn allows moisture to penetrate further into the panel.

It is an object of the present invention to provide a method of alleviating this disadvantage.

According to the present invention, there is provided a method of manufacturing a panel comprising at least one photo-voltaic cell located between a transparent sheet and a second sheet bonded together using an adhesive material characterised in that another material is applied at least in part between the sheets to form a moisture barrier which surrounds said cell(s) and said adhesive.

The present invention therefore enables the adhesive material to be selected quite independently of any required moisture-proof qualities, since these are conferred on the panel by the barrier material. The adhesive material may therefore be selected for example for its transparency alone, and the barrier material may be selected for its sealing powers and chemical compatibility with the adhesive material.

Preferably, each said cell is laminated between said sheets using a transparent adhesive.

It is preferred that such barrier forming material should have a water permeability of not more than 6 g of water per $m^2$ of surface per mm of material depth per cm Hg pressure per 24 hours.

The adoption of this feature will ensure that water ingress to the adhesive material is strongly retarded.

Preferably, said barrier forming material is selected from neoprene based adhesives and polysulphide adhesives, for example Thiokol (Trade Mark) type adhesives.

Polyvinylidene chloride (PVDC) is another very suitable barrier forming material because of its low water permeability. It is noted that PVDC is not chemically compatible with polyvinyl butyral (PVB) since the PVDC solvents normally used have an adverse effect on the PVB structure. PVB is an especially preferred transparent adhesive material. Accordingly, some preferred embodiments of the invention provide that the adhesive material (e.g. PVB) should be surrounded by a body of a first barrier forming material (e.g. PVDC), with a body of a second barrier forming material (e.g. a polysulphide adhesive) interposed between them.

The water permeability requirements of said second barrier forming material are not critical, though clearly for optimum results such material should not be adversely affected by moisture; all that is necessary is that it should be chemically compatible with the contacting bodies of adhesive. Polysulphide adhesives such as Thiokol are especially suitable for interposing between bodies of PVB and PVDC.

Preferably said adhesive material is used in film form and each such film is cut to an area less than that of either of said sheets and is assembled between them to leave a peripheral groove which is filled with the barrier forming material.

The barrier forming material may be used in strip form as a marginal frame between said sheets.

Preferably said panel is laminated by heating an assembly comprising said two sheets assembled on either side of one or more intervening thermoplastic adhesive layers and said cell(s) to soften or melt the said thermoplastic layer(s) and exposing the assembly to heat and pressure conditions such as to cause the said sheets to become firmly bonded by means of such thermoplastic layer(s), while there is applied to the assembly means which envelope at least the edges thereof, to define, with such edges, a space around the edges in which sub-atmospheric pressure can be created for subjecting the inter sheet space to suction at said edges, and in a preliminary treatment stage before the assembly is subjected to said firm bonding conditions, the assembly is exposed to sub-atmospheric pressure acting upon at least one of the main external faces of the assembly while the assembly is exposed to heat in a treatment chamber and the inter-sheet spaces are subjected to said suction produced by sub-atmospheric pressure within the space around the edges of the assembly.

The performance of the said preliminary treatment in which the inter-sheet space is subjected to suction while the assembly is in a heated condition and is in a work space at sub-atmospheric pressure affords the advantage that when the assembly is subsequently exposed to firm bonding conditions, an improved bonding of the sheets, and therefore a superior product, is obtained. This appears to be due at least in part to removal of at least some air and moisture and in some cases also some solvent (present in the plastics), from between the plies before they become firmly bonded together. In some cases, depending on the temperature in the preliminary treatment zone and the duration of such treatment, quantities of gas, occluded in the plastics, are removed, and this further contributes to the good results. The sucking off of vapour and/or gas from between the sheets at the edges of the assembly is facilitated by the fact that the whole assembly is exposed to sub-atmospheric environmental pressure. It was found that if the assembly as a whole is not exposed to sub-atmospheric environmental pressure, the subjection of the inter-sheet space to suction by creating an external sub-atmospheric pressure around the edges of the assembly does not have so advantageous an effect, due presumably to trapping of gas bubbles between the sheets in the central part of the assembly.

In order to promote rapid degasification, the said external sub-atmospheric pressure in said space around the edges of the assembly edges is preferably or is preferably reduced to not more than 10 mm of mercury.

The environmental pressure acting upon at least one of the main external faces of the assembly during the preliminary treatment is preferably reduced to not more than 400 mm of mercury. Such pressures are sufficiently below atmospheric to permit substantial extraction of water vapour from between the sheets in a short period of time in the case of assemblies incorporating sheets of a size and weight within the ranges ordinarily encountered in the manufacture of glazing panels. Moreover, if the said environmental pressure acting upon at least one of the main external faces of the assembly is or becomes as low as 400 mm of mercury or less, the effect of exposing the assembly to atmospheric or higher environmental pressure at the end of the preliminary treatment, in forcing the sheets together, can be appreciable.

The maximum temperature of the assembly during the preliminary treatment according to preferred embodiments of the invention will depend on the adhesive material used. When the adhesive used is polyvinyl butyral, that temperature is preferably at least 60° C. At that temperature the extraction of air and water vapour from between the sheets can proceed reasonably quickly without having to use very low environmental pressures. Generally, useful degasification of the adhesive material will occur if the maximum preliminary treatment temperature is as high as possible. However, the maximum temperature should be maintained at or below a level at which there is little risk of air and moisture extraction from between the sheets being hindered by premature bonding of the sheets. In other words, the maximum temperature will be chosen so that the temperature of the plastic layer is maintained below the level at which the plastic will begin to stick to the glass, such level being, in the case of polyvinylbutyral, 70° to 80° C.

The most preferred transparent adhesive material is polyvinyl butyral.

Preferably, said at least one cell is laminated between two sheets of adhesive material. It is especially preferred that three sheets of adhesive material are used with each said cell nesting in a hole in the central sheet.

The invention extends to a panel made by a process as above defined, and includes a panel comprising at least one photo-voltaic cell located between a transparent sheet and a second sheet bonded together by an intervening adhesive material characterised in that the cell(s) and said adhesive are surrounded by a body of another material which is located at least in part between the sheets and forms a moisture barrier which surrounds said cell(s) and said adhesive.

Said transparent sheet may for example be of a plastic material, but it is preferably of glass, as is said second sheet.

Advantageously said barrier forming material is selected from neoprene based adhesives, polysulphide adhesives and polyvinylidene chloride.

Preferably said adhesive material is polyvinyl butyral which is surrounded by a first said barrier of polyvinylidene chloride with a second said barrier of polysulphide adhesive interposed between them.

Advantageously said adhesive material is transparent and totally encapulates said cell(s).

An embodiment of the invention selected by way of example, will now be described with reference to the accompanying diagrammatic drawings in which:

FIG. 2 is an exploded perspective view of a sandwich assembly for forming a panel according to the invention;

FIG. 3 is a cross-section through the panel of FIG. 2 after assembly;

FIG. 5 is a cross-section through yet another panel according to the invention.

Figure 1:
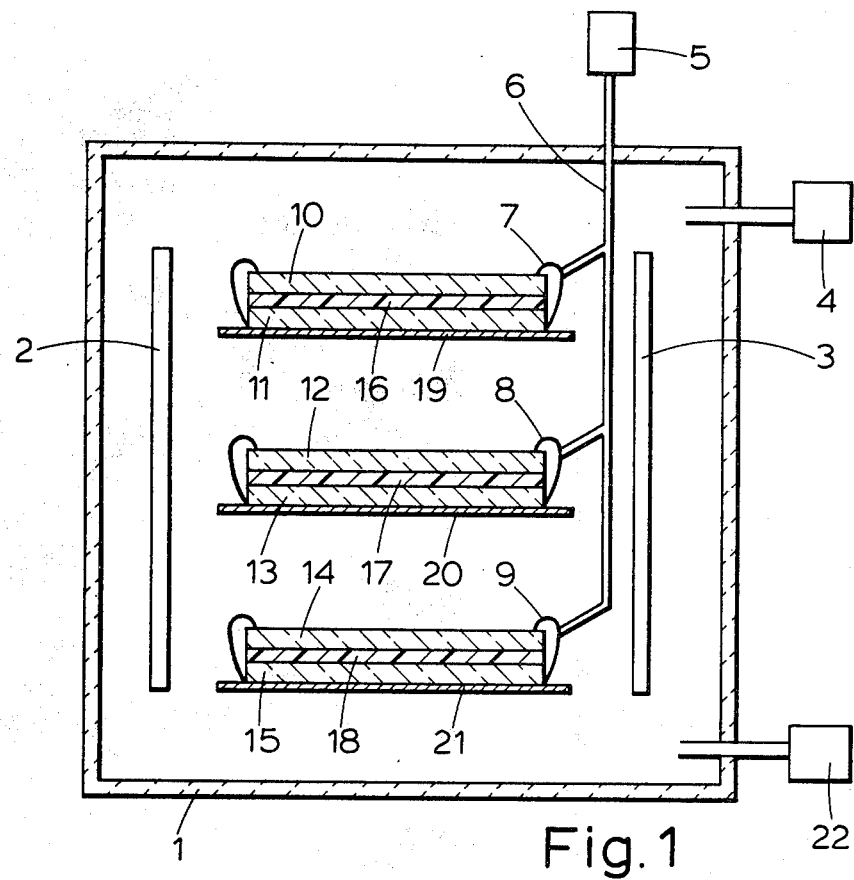
FIG. 1 is a vertical cross-section of an apparatus suitable for performing the method according to the invention.

The apparatus illustrated in FIG. 1 comprises an enclosure 1, in which can be placed a plurality of sandwich assemblies for bonding together to form panels in accordance with the invention. By way of illustration, three such assemblies are shown in FIG. 1.

The enclosure 1 is provided with heating elements 2 and 3.

Two vacuum pumps 4 and 5 are associated with the enclosure 1. Pump 4 is connected to the environmental atmosphere within the enclosure and the pump is connected via a conduit 6 to sealing tubes 7, 8 and 9 which are made of flexible material.

The apparatus functions in the following manner:

The flexible sealing tubes 7, 8 and 9 are each an endless tube which is open at its inner periphery and is fitted to the margin of an assembly which is to be bonded. The three illustrated assemblies each comprise two glass sheets 10 and 11 or 12 and 13 or 14 and 15 and intervening adhesive material 16 or 17 or 18, respectively, in which is embedded one or more photo-voltaic cells (not shown). In one particular case, the adhesive material is polyvinyl butyral. The adhesive material is in each case in film form of slightly smaller dimensions than the glass sheets so as to leave a groove around the edge of the panel. The assemblies are each placed on a support 19 or 20 or 21 which is fixedly located in the enclosure 1 by any convenient means (not shown). The heating elements 2, 3 maintain the temperature in the enclosure at about 100° C.

On being introduced into the enclosure 1, the assemblies are immediately heated. At the same time, the vacuum pump 4 creates in the enclosure 1 a pressure which is below atmospheric and not more than 400 mm of mercury. In one particular case, the environmental pressure in the enclosure 1 is maintained at about 200 mm of mercury, while the pump 5 reduces the pressure within the marginal sealing tubes 7, 8, 9 to 3 mm of mercury. The pressure within the sealing tubes can be higher than that but it is in any case preferably lower than 10 mm of mercury.

The assemblies are progressively heated in order to facilitate their degasification. In one particular embodiment, the temperature of the assembly increases 6° C. per minute. When the temperature of the assembly reaches 80° C., the pre-bonding stage is commenced by increasing the environmental pressure in the enclosure 1 to atmospheric. This pressure acts on the upper main external face of each assembly. The sub-atmospheric pressure within the tubes 7, 8, 9 is meanwhile maintained, while the assemblies continue to be heated until they reach a temperature of 100° C. The conduit 6 is then disconnected from the sealing tubes 7, 8, 9 so that the whole of each assembly is subjected to atmospheric pressure. The environmental temperature within the enclosure 1 is then raised by the heating elements 2 and 3. This temperature can be raised to 150° C. The assemblies continue to be heated until they reach a temperature of 140° C., at which temperature the polyvinyl butyral layer attains its condition of maximum adhesiveness. While the temperature of the assemblies is rising to 140° C., a compressor pump 22 is switched on to cause the environmental pressure in the enclosure to rise to 1 kg/cm².

When the firm bonding conditions have been realised, the laminates are progressively cooled before they are removed from the enclosure 1, and the grooves (not shown) around the edges of the panels are filled with barrier forming material.

In a variant apparatus, a similar method is carried out in a more continuous manner.

Such a variant apparatus could for example comprise a tunnel-like enclosure divided into a number of different treatment chambers by movable gates, and incorporate conveyor means for carrying the assemblies being treated from one chamber to the next.

For example, a first such chamber could be maintained at about 100° C. and be provided with a vacuum pump such as 4 for degasification. After this stage is completed, the pressure in the first chamber, having been returned to atmospheric when the temperature of the assembly or assemblies therein was about 80° C., and a conduit such as 6 having been disconnected from a marginal sealing tube such as 7, 8 or 9 for each assembly, the assembly or assemblies are conveyed through a gate into a second chamber maintained at 150° C. and provided with a compressor such as 22. After firm bonding conditions have been reached in the second chamber, each laminated assembly is then conveyed through another gate into a third chamber at the same temperature and pressure as the second. Temperature and pressure conditions in this third chamber are progressively returned to ambient atmospheric conditions, and the finished laminate is removed.

In FIGS. 2 and 3, a solar panel comprises two glass sheets 23 which are to be bonded together using three intervening films, 24, 25, 26 of transparent adhesive material such as polyvinyl butyral. The central film 25 has a hole in which nests a photo-voltaic cell 27.

In a particular practical example, this cell is a silicon cell. The silicon is doped with a pentavalent material (usually phosphorus) and is in the form of a thin disc impregnated on one face with a trivalent material (usually boron) to form a p-n junction. As is well known, when infra red or visible light energy is incident on the impregnated face of such a cell, a potential difference is set up across the disc so that current can flow through a circuit of which it is a part. A conductive grid 28, shown in the form of a spine interconnecting transverse ribs, is applied to the impregnated face of the disc 27, while the other face of the disc bears a uniform conductive coating (not shown). The conductive grid 28 and the coating may be of silver. The silicon disc constituting the cell 27 may have a diameter of 55 mm and a thickness of 0.1 to 0.3 mm. Such a cell can have an output of 0.6 ampere at 0.44 volt.

It will be noted that the three intervening films 24, 25, 26 are of lesser area than the two glass sheets, so that when the panel is assembled there will be a groove leading around the edge of the panel.

After assembly, the panel 1 may be bonded together as described with reference to FIG. 1.

The groove leading around the edge of the panel is then filled with a body of barrier forming material 29 such as PRC polysulphide sealant sold by Le Joint Francais which serves to inhibit the ingress of moisture into the panel and thus preserves the efficiency of the photovoltaic cell 27.

Figure 4:
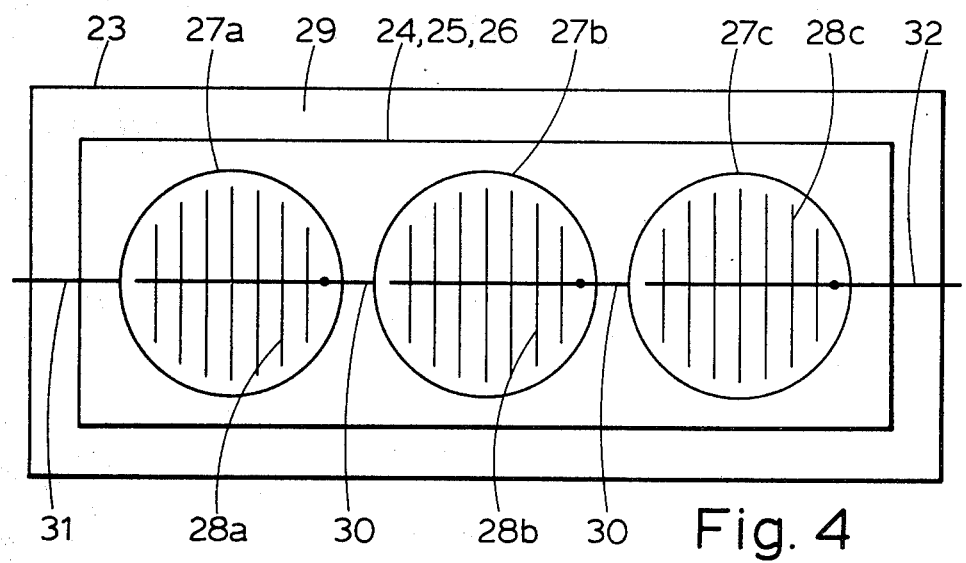
FIG. 4 is a plan view of another panel according to the invention.

FIG. 4 shows a modified form of panel in which the various parts are given the same reference numerals as corresponding parts of FIGS. 2 and 3. Barrier forming material 29 is formed into a marginal frame intervening between glass sheets 23 and surrounding transparent adhesive material 24, 25, 26 in which are embedded three photo-voltaic cells 27a, 27b and 27c. The conductive grid 28a on the front face of the first cell 27a is connected to the uniform coating (not shown) on the rear face of the second cell 27b by a conductor 30, and the conductive grid 28b on the second cell is likewise connected to the uniformly coated face of the third cell 27c. Lead-in wires 31, 32 are respectively connected to the rear face of the first cell 27a and the conductive grid 28c of the third cell 27c.

In another embodiment of panel which is illustrated in FIG. 5, cells such as 27 are embedded in a layer of polyvinyl butyral formed from three sheets 24, 25, 26 of that material, and the polyvinyl butyral layer is surrounded by a body of polyvinylidene chloride as barrier forming material.

Since solvents normally present in commercially available polyvinylidene chloride have a deleterious effect on the structure of polyvinyl butyral, a second body 30 of barrier forming material is interposed between the body 29 and the polyvinyl butyral. The second body 30 is formed of Thiokol (Trade Mark) polysulphide adhesive.

A further general advantage of the present invention is that if it should become necessary, the protective adhesive material can be replaced in a panel without disturbing the lamination which secures the photo-voltaic cell or cells in place.

We claim:

1. A method of manufacturing a panel of the kind which comprises at least one photo-voltaic cell located between a transparent sheet and a second sheet, said method comprising: bonding said sheets together with the voltaic cell therebetween by assembling between the sheets a laminating adhesive in the form of at least one film of polyvinylbutyral which has been cut to an area less than that of either of said sheets so that in the assembled bonded form there is a peripheral groove around the assembly, and filling the peripheral groove with another adhesive material applied at least in part between the sheets to form a moisture barrier which surrounds said photo-voltaic cell and said first-mentioned adhesive.

2. A method as in claim 1 wherein said laminating adhesive is transparent.

3. A method as in claim 1 or 2 wherein said barrier forming material has a water permeability of not more than 6 g of water per m² of surface per mm of material depth per cm Hg pressure per 24 hours.

4. As method as in claim 1 wherein said barrier forming material comprises a material selected from neoprene based adhesive and polysulphide adhesives.

5. A method as in claim 3 wherein said barrier forming material comprises polyvinylidene chloride.

6. A method as in claim 2 including interposing a body of a second barrier forming material between said laminating adhesive and said first barrier forming material.

7. A method as in claim 6 wherein said laminating adhesive material is polyvinyl butyral, said second barrier forming material comprises a polysulphide adhesive and said first barrier forming material is polyvinylidene chloride.

8. A method as in claim 1 wherein said panel is laminated by heating an assembly comprising said two sheets assembled on either side of one or more intervening thermoplastics adhesive layers and said cell to soften or melt the said thermoplastics layer and exposing the assembly to heat and pressure conditions such as to cause said sheets to become firmly bonded by means of such thermoplastics layer, while there is applied to the assembly means which envelope at least the edges thereof, to define, with such edges, a space around the edges in which sub-atmospheric pressure can be created for subjecting the inter sheet space to suction at said edges, and in a preliminary treatment stage before the assembly is subjected to said firm bonding conditions, the assembly is exposed to sub-atmospheric environmental pressure acting upon at least one of the main external faces of the assembly while the assembly is exposed to heat in a treatment chamber and the intersheet space is subjected to said suction produced by sub-atmospheric pressure within the space around the edges of the assembly.

9. A method as in claim 8 wherein the external sub-atmospheric pressure in said space around the edges of the assembly edges is reduced to not more than 10 mm of mercury.

10. A method as in claim 8 or 9 wherein the environmental pressure acting upon at least one of the main external faces of the assembly during the preliminary treatment is reduced to not more than 400 mm of mercury.

11. A method as in claim 1 wherein said cell is laminated between two sheets of adhesive material.

12. A method as in claim 11 wherein three sheets of adhesive material are used with the or each said cell nesting in a hole in the central sheet.

13. A panel comprising at least one photo-voltaic cell located between a transparent sheet and a second sheet bonded together by an intervening laminating adhesive layer of polyvinylbutyral and a body of another adhesive material surrounding said cell and said laminating adhesive, said body being located at least in part between the sheets and forming a moisture barrier which surrounds said cell and said laminating adhesive.

14. A panel as in claim 13 wherein said transparent sheet is a glass sheet.

15. A panel as in claim 13 or 14 wherein said barrier forming material is selected from the group consisting of neoprene based adhesives, polysulphide adhesives and polyvinylidene chloride.

16. A panel as in claim 13 or 14 wherein said barrier forming material is polyvinylidene chloride and including a second said barrier of polysulphide adhesive interposed between said first barrier layer and said laminating adhesive.

17. A panel as in claim 13 or 14 wherein said laminating adhesive material is transparent and totally encapsulates said cell.

* * * * *